(12) United States Patent
Simmons et al.

(10) Patent No.: US 7,653,505 B1
(45) Date of Patent: Jan. 26, 2010

(54) METHOD AND APPARATUS FOR TESTING A CONTROLLED IMPEDANCE BUFFER

(75) Inventors: Tuyet Ngoc Simmons, Monte Sereno, CA (US); Madan Patra, Santa Clara, CA (US); Prasad Rau, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 138 days.

(21) Appl. No.: 12/048,584

(22) Filed: Mar. 14, 2008

(51) Int. Cl.
  *G06F 17/60* (2006.01)
(52) U.S. Cl. .............. 702/118; 702/117; 702/120; 702/121; 714/43; 714/733; 714/718; 714/744; 714/724; 326/30; 326/82; 365/230.05
(58) Field of Classification Search ............ 702/117, 702/118, 120, 121; 714/43, 700, 733, 736, 714/718, 744, 724, 726, 740; 326/30, 82, 326/83, 86, 87; 324/537, 550, 158.1, 600; 365/201, 96, 230.05, 236.6, 225.7, 230.06
See application file for complete search history.

(56) References Cited

U.S. PATENT DOCUMENTS

| | | | | |
|---|---|---|---|---|
| 4,837,765 A | * | 6/1989 | Suzuki | 714/724 |
| 5,115,437 A | * | 5/1992 | Welles et al. | 714/733 |
| 5,952,833 A | * | 9/1999 | Morgan | 324/537 |
| 6,087,847 A | * | 7/2000 | Mooney et al. | 326/30 |
| 6,163,499 A | * | 12/2000 | Suzuki | 365/230.06 |
| 6,178,128 B1 | * | 1/2001 | Morgan | 365/201 |
| 6,236,219 B1 | * | 5/2001 | Morgan | 324/550 |
| 6,263,295 B1 | * | 7/2001 | Morgan | 702/117 |
| 6,373,762 B2 | * | 4/2002 | Morgan | 365/201 |
| 6,425,097 B1 | * | 7/2002 | Elachkar et al. | 714/43 |
| 6,472,862 B1 | * | 10/2002 | Morgan | 324/158.1 |
| 6,686,747 B2 | * | 2/2004 | Morgan | 324/600 |
| 6,922,074 B2 | * | 7/2005 | Coughlin et al. | 326/30 |
| 2001/0015915 A1 | * | 8/2001 | Morgan | 365/189.09 |
| 2002/0036513 A1 | * | 3/2002 | Hashimoto | 324/765 |
| 2002/0042746 A1 | * | 4/2002 | Morgan | 705/21 |

\* cited by examiner

Primary Examiner—Carol S Tsai
(74) Attorney, Agent, or Firm—Michael T. Wallace

(57) ABSTRACT

A method and apparatus is provided to utilize the configurability of a programmable logic device (PLD), so as to reduce the complexity of special test equipment (STE) fixtures that are required to test the PLD. The output drivers of certain I/O buffers of the PLD that are not under test may be configured to exhibit a particular impedance magnitude. The impedance magnitude of the output drivers that are not under test may then be used to supply the reference impedance that is required by the digitally controlled impedance (DCI) controllers of the I/O buffers that are under test. The DCI controllers may then correctly configure the impedance magnitude of the respective I/O buffers under test, so as to test the functionality of the controlled impedance buffers for I/O standards that require controlled impedance.

20 Claims, 6 Drawing Sheets

METHOD AND APPARATUS FOR TESTING A CONTROLLED IMPEDANCE BUFFER

FIELD OF THE INVENTION

The present invention generally relates to programmable logic devices (PLDs), and more particularly to the testing of the plurality of controlled impedance buffers within the PLD.

BACKGROUND OF THE INVENTION

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells during a configuration event that defines how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these PLDs, the functionality of the device is controlled by configuration data bits provided to the device for that purpose. The configuration data bits can be stored in volatile memory (e.g., static memory cells, as in FPGAs and some CPLDs), in non-volatile memory (e.g., FLASH memory, as in some CPLDs), or in any other type of memory cell.

Due to their high degree of configurability, FPGAs are ideally suited for the implementation of one or more I/O interfaces that are capable of supporting a large number of input/output (I/O) interface standards. For example, many modern processing systems operate according to the peripheral component interconnect (PCI) standard, which among other features, defines a specification for attaching peripheral devices to a computer mother board. In other examples, modern processing systems may also utilize the high speed transceiver logic (HSTL) standard for data transfers to and from memory, and/or the low-voltage differential signaling (LVDS) standard for backplane communications.

Some of the I/O standards that may be supported by an FPGA also require a controlled impedance at the respective input and output terminals of the I/O buffers, so as to maintain signal integrity despite the increasingly faster edge rates that must be supported by the I/O buffer. Discrete resistors have traditionally been employed to provide such a controlled impedance, but the amount of circuit board area required by the discrete resistors is prohibitive, especially in light of the fact that modern FPGAs contain many banks of I/O buffers. In addition, locating each resistor in close proximity to each I/O buffer, as required to optimize impedance control, may be physically impossible.

Digitally controlled impedance (DCI) may, therefore, be employed to configure the I/O buffer with on-die termination impedance, thus obviating the need for external resistors. The DCI controller adjusts the output impedance, or the input termination impedance, to appropriately match the characteristic impedance of the transmission medium. In particular, a DCI controller is implemented for each bank of I/O buffers, whereby the DCI controller adjusts the impedance of each I/O buffer within the bank of I/O buffers to be proportional to the impedance magnitude of external reference resistors that are connected to impedance reference pins of each I/O bank. As such, each I/O buffer exhibits the correct input/output impedance that may be required by the controlled impedance I/O standard that may be supported by the I/O buffer.

In order to test controlled impedance I/O standards for each I/O bank, traditional test methodologies require that a pair of discrete resistors be connected to the impedance reference pins of each I/O bank under test. Such resistor connections are typically implemented within special test equipment (STE) fixtures, whereby the STE fixtures facilitate the testing of multiple FPGAs simultaneously, by providing all I/O and power connections that are required for each test scenario.

Since each I/O bank of each FPGA is configurable, however, an I/O bank may be configured to support a controlled impedance I/O standard, such as HSTL, during a first test scenario, but may be re-configured to support a non-controlled impedance I/O standard, such as PCI, during a second test scenario. As such, the STE fixture is further required to employ switching means, such as relays, to connect the discrete resistors to the impedance reference pins of each I/O bank that is to be tested during the first test scenario. The STE fixture is then required to disconnect the discrete resistors from the impedance reference pins of each I/O bank that is to be tested during the second test scenario.

STE fixtures are often configured as multi-site testers, whereby multiple FPGAs are tested simultaneously. As such, the complexity of the STE fixture is necessarily exacerbated when the STE fixture is required to support the testing of both controlled and non-controlled impedance I/O standards for each I/O buffer of each FPGA under test. Efforts continue, therefore, to utilize the configurability of the FPGA to reduce the complexity of the STE fixture without sacrificing test support for controlled impedance I/O standards.

SUMMARY OF THE INVENTION

To overcome limitations in the prior art, and to overcome other limitations that will become apparent upon reading and understanding the present specification, various embodiments of the present invention disclose a method and apparatus for the testing of controlled impedance buffers of one or more programmable logic devices.

In accordance with one embodiment of the invention, a method of testing a controlled impedance driver comprises identifying a first driver of a first bank of drivers that is to be tested, identifying second and third drivers that are not to be tested, programming an output impedance of the second and third drivers to exhibit first and second impedance magnitudes, routing the first and second impedance magnitudes to reference impedance inputs of the first bank of drivers to control an output impedance of the first driver, and testing the first driver as the controlled impedance driver.

In accordance with another embodiment of the invention, a method of testing a plurality of integrated circuits comprises interconnecting a plurality of driver banks of the plurality of integrated circuits using a test fixture, selecting a first driver bank of the plurality of driver banks to be tested, programming a second driver bank of the plurality of driver banks to provide a first reference impedance magnitude to the first driver bank, programming a third driver bank of the plurality of driver banks to provide a second reference impedance magnitude to the first driver bank, determining an output impedance of the first driver bank to be proportional to the first and second reference impedance magnitudes, and conducting controlled impedance testing of the first driver bank.

In accordance with another embodiment of the invention, a test system comprises a plurality of programmable logic devices, where each of the programmable logic devices includes a plurality of driver banks, and each driver bank includes an output driver that is configurable as a programmable resistive component. The test system further comprises a test fixture that is coupled to an output node of each output driver that is included within each of the plurality of driver banks. The test fixture is further coupled to reference impedance nodes of the plurality of driver banks. The test fixture is then adapted to connect each output driver that is configured as a programmable resistive component to the reference impedance nodes of a driver bank that is under test to program an impedance value of the driver bank that is under test.

BRIEF DESCRIPTION OF THE DRAWINGS

Various aspects and advantages of the invention will become apparent upon review of the following detailed description and upon reference to the drawings in which.

DETAILED DESCRIPTION

Generally, various embodiments of the present invention are applied to the field of integrated circuits (ICs) of which integrated circuits with programmable logic, such as programmable logic devices (PLDs), are a subset. In particular, a method and apparatus is provided to utilize the configurability of programmable logic in an integrated circuit, so as to reduce the complexity of special test equipment (STE) fixtures that are often required to test programmable logic and the circuits configured into it.

In a first embodiment, the output drivers of certain I/O buffers of a PLD, such as a field programmable gate array (FPGA), that are not under test may be configured to exhibit a particular impedance magnitude. The impedance magnitude of the output drivers that are not under test may then be used to supply the reference impedance that is required by the digitally controlled impedance (DCI) controllers of the I/O buffers that are under test. As such, the STE fixtures are not required to connect discrete resistive components to the reference impedance pins of each I/O bank. Instead, output drivers of the FPGA that are not currently under test are configured to exhibit a particular impedance and are then connected to the reference impedance pins of the I/O buffers that are under test. In response, the DCI controllers of each I/O bank under test may correctly configure the impedance magnitude of the respective I/O buffers, so as to test the functionality of the controlled impedance buffers during support of I/O standards that require on-die termination impedance.

Figure 1:
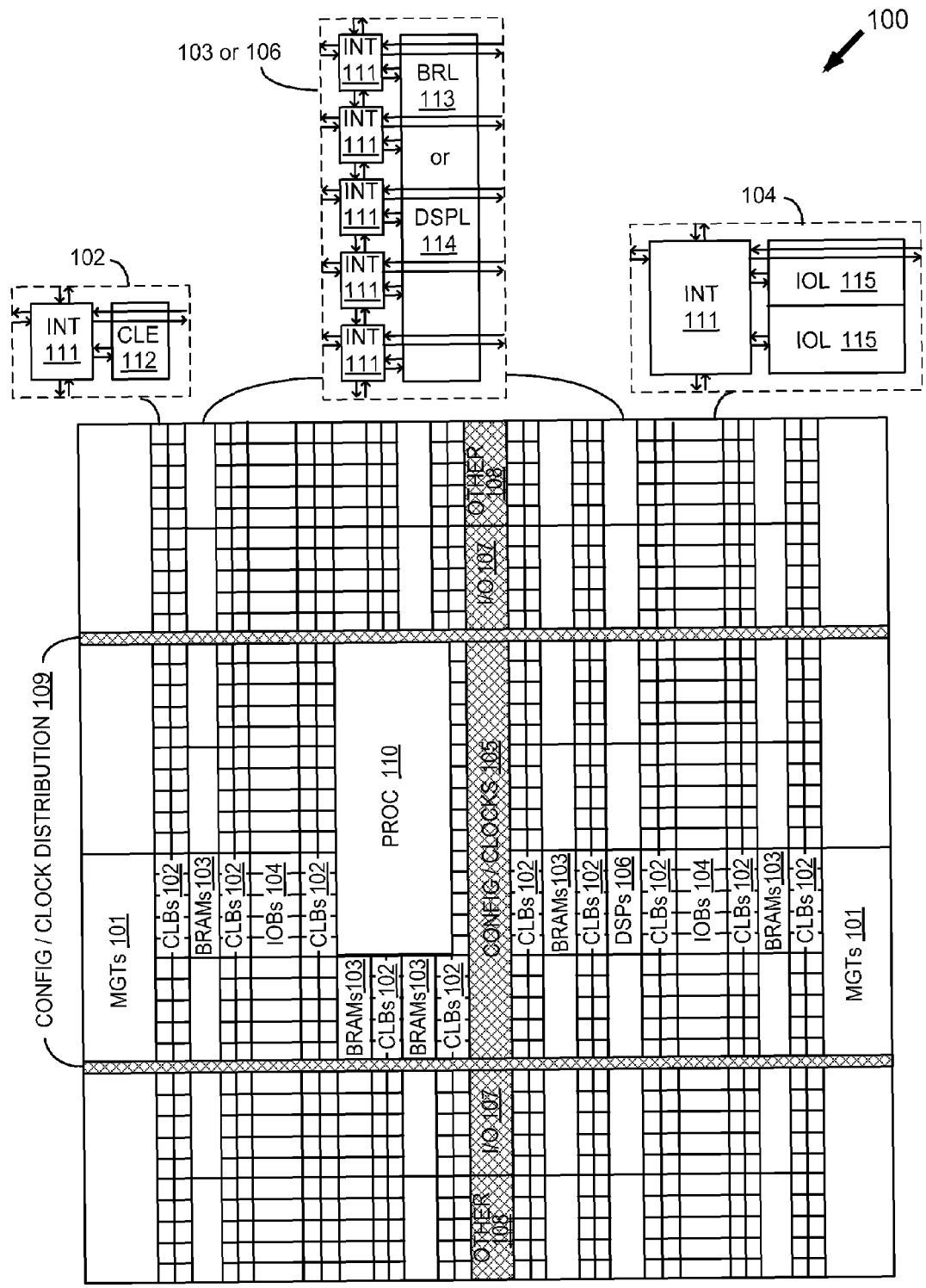
FIG. 1 illustrates an exemplary Field Programmable Gate Array (FPGA) architecture.

As noted above, advanced FPGAs can include several different types of programmable logic blocks in the array. For example, FIG. 1 illustrates an FPGA architecture 100 that includes a large number of different programmable tiles including multigigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 typically are not confined to the area of the input/output logic element 115.

In the pictured embodiment, a columnar area near the center of the die (shown crosshatched in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs are typically included wherever the CLBs appear, to facilitate the efficient implementation of user logic, but the number of adjacent CLB columns varies with the overall size of the FPGA.

Figure 2:
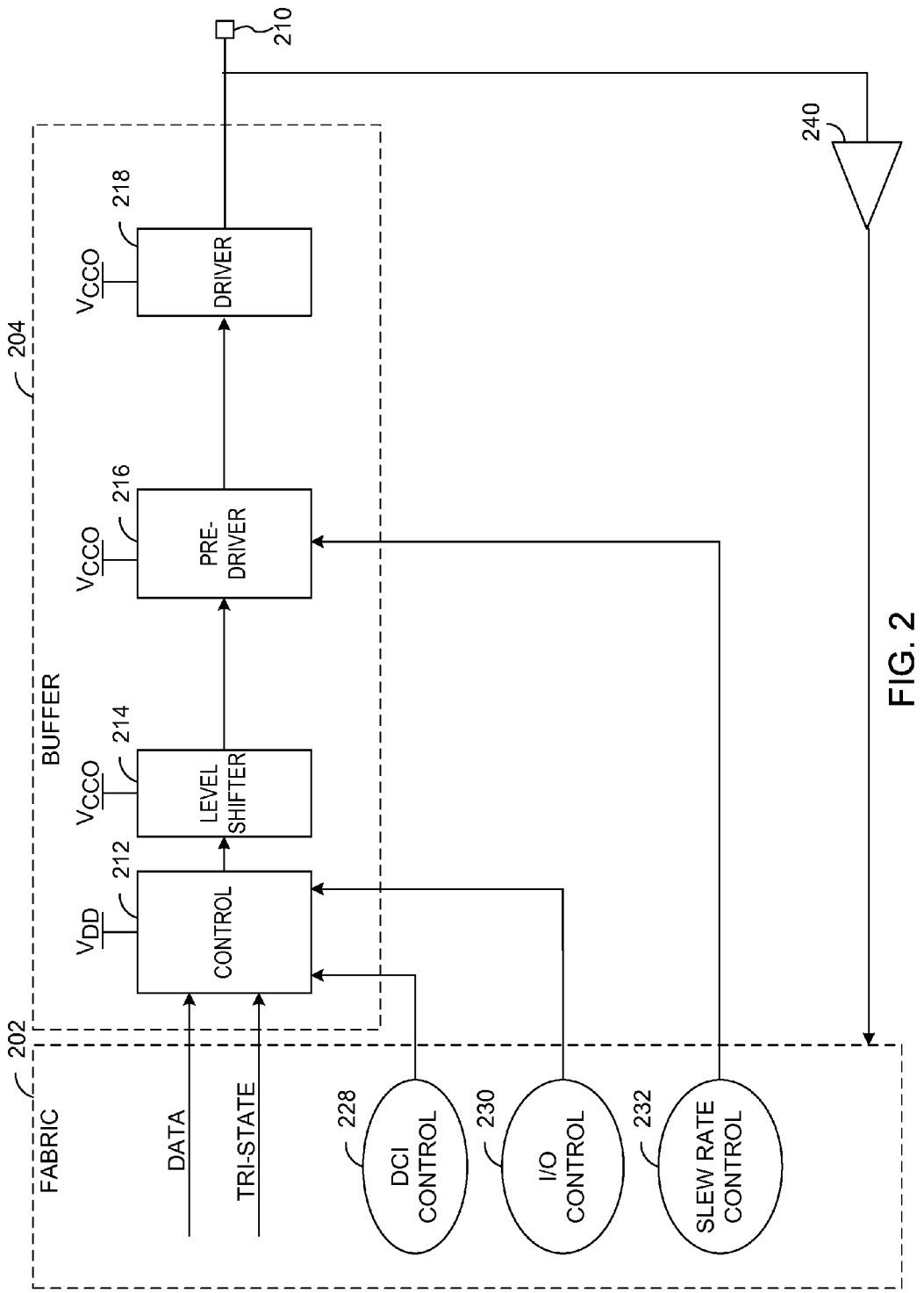
FIG. 2 illustrates a schematic diagram of an input/output block (IOB) of the FPGA of FIG. 1.

Turning to FIG. 2, a schematic diagram of IOB 104 and a portion of the associated control circuitry of FIG. 1 is illustrated. FPGA fabric 202 may assert/deassert signal TRI-STATE, so as to disable/enable, respectively, output buffer 204. Similarly, FPGA fabric 202 may provide signal DATA to output buffer 204 given that output buffer 204 is enabled by signal TRI-STATE. It should be noted that while the I/O buffer of FIG. 2 provides output buffer 204 to transmit signal DATA from fabric 202 to output pad 210, input buffer 240 may be similarly provided, which operates to receive a signal from input pad 210 and in response, provides the received data signal to fabric 202.

Data and control inputs are received by output buffer 204 from fabric 202 of the FPGA to configure output buffer 204 to operate in accordance with a plurality of I/O standards. In particular, the schematic diagram of FIG. 2 illustrates components of an FPGA based I/O interface that may be configured to support I/O standards such as low-voltage complementary metal oxide semiconductor (LVCMOS), low-voltage transistor-transistor logic (LVTTL), high-speed transceiver logic (HSTL), stub-series terminated logic (SSTL), gunning transceiver logic (GTL), and peripheral component interface (PCI).

Variations of each I/O standard may be configured using digitally controlled impedance (DCI) control 228, I/O control 230, and slew rate control 232, all of which are provided by configuration memory cells and/or dynamic control signals from fabric 202. Using control blocks 230-232, for example, the output signal parameters of output buffer 204, such as voltage out high ($V_{OH}$), voltage out low ($V_{OL}$), duty cycle, rise time, and fall time may be configured. In addition, should the I/O standard require on-die termination impedance, DCI control 228 is utilized to activate the appropriate transistor bank(s) within driver 218 so as to implement the required output impedance of driver 218. As discussed in more detail below, DCI control 228 calibrates the required termination impedance of driver 218 through the use of a reference impedance that is provided by other output driver(s) 218 (not shown) within the FPGA.

Control block 212 operates at a first voltage magnitude, e.g., $V_{DD}$, which is the same operational voltage magnitude that is utilized by fabric 202. Since pre-driver 216 and output driver 218 operate at a relatively higher voltage magnitude, e.g., $V_{CCO}$, level shifter block 214 is required, which translates data operating at the core voltage magnitude, e.g., $V_{DD}$, to data operating at the I/O voltage magnitude, e.g., $V_{CCO}$.

Driver 218 is comprised of a number of transistor banks, whereby each transistor bank contains a variable number of n-type metal oxide semiconductor (NMOS) transistors and a variable number of p-type metal oxide semiconductor (PMOS) transistors. Each of the variable number of PMOS transistors have drain terminals that are commonly coupled to the drain terminals of the variable number of NMOS transistors. The gate terminals of each PMOS transistor are commonly coupled to a first select signal, e.g., PGATE, while the gate terminals of each NMOS transistor are commonly coupled to a second select signal, e.g., NGATE.

Figure 3:
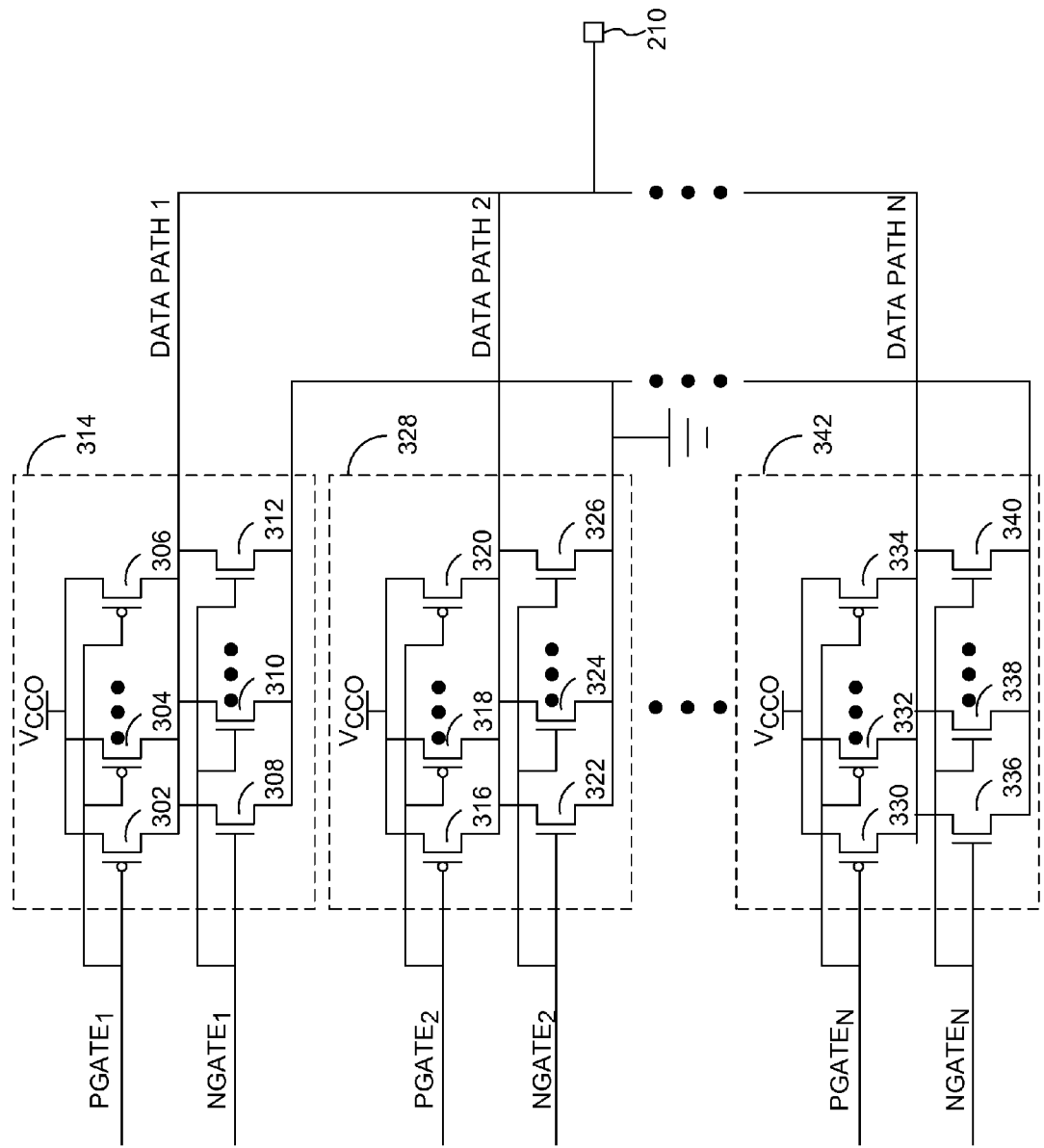
FIG. 3 illustrates an output driver of the IOB of FIG. 2.

Turning to FIG. 3, for example, a schematic diagram that is representative of driver 218 of IOB 104 is illustrated. It is understood that driver banks 314, 328, and 342 are identical, except that the number of NMOS and PMOS transistors utilized for each leg of each driver bank may be different from one driver bank to another. One or more of driver banks 314, 328, and 342 may be independently configured by control block 212 to operate as programmable current drivers via control signals that are provided by I/O control 230. One or more of the remaining driver banks 314, 328, and 342, on the other hand, may be independently configured by control block 212 to operate as digitally controlled impedance devices via control signals that are provided by DCI control 228.

For example, driver bank 314 may be configured as a bank of PMOS transistors 302-306 that provides a predetermined amount of $I_{OH}$ at output pad 210 for data path 1 and a bank of NMOS transistors 308-312 that provides a pre-determined amount of $I_{OL}$ at output pad 210 for data path 1. Similarly, driver bank 328 may be configured as a bank of PMOS transistors 316-320 that provides a predetermined amount of $I_{OH}$ at output pad 210 for data path 2 and a bank of NMOS transistors 322-326 that provides a pre-determined amount of $I_{OL}$ at output pad 210 for data path 2. Conversely, driver bank 342 may be configured as a bank of PMOS transistors 330-334 that provides a predetermined amount of pull-up resistance at output pad 210 for data path N and a bank of NMOS transistors 336-340 that provides a pre-determined amount of pull-down resistance at output pad 210 for data path N.

In one embodiment, the number of NMOS transistors contained within driver bank 314 may be greater than the number of NMOS transistors contained within driver banks 328 and 342. In addition, the number of PMOS transistors contained within driver bank 314 may be greater than the number of PMOS transistors contained within driver banks 328 and 342. In such an instance, the magnitude of $I_{OH}$ and $I_{OL}$ as provided by driver bank 314 may be greater than the magnitude of $I_{OH}$ and $I_{OL}$ as provided by driver banks 328 and 342. Conversely, the magnitude of pull-up and pull-down resistance as provided by driver bank 314 may be less than the magnitude of pull-up and pull-down resistance as provided by driver banks 328 and 342. The numbers of PMOS and NMOS transistors contained within the other driver banks (not shown) of FIG. 3 may be similarly apportioned, such that a monotonic, binary, or other programmable output current drive/impedance magnitude may be applied to output pad 210 depending upon the number of driver banks that are enabled for output current drive and the number of driver banks that are enabled for impedance control.

In an alternate embodiment, each of driver banks 314, 328, and 342 may be solely utilized to provide a programmable magnitude of pull-up or pull-down resistance at node 210. In particular, signal $PGATE_1$, as provided by pre-driver 216, may be deasserted to a logic low level to render PMOS transistors 302-306 conductive. The drain-source resistances, $R_{DS}$, as provided by the conductive states of each of PMOS transistors 302-306, are placed in parallel to implement a combined resistance magnitude, e.g., R1P, between output pad 210 and terminal $V_{CCO}$. Similarly, signal $NGATE_1$, as provided by pre-driver 216, may be asserted to a logic high level to render NMOS transistors 308-312 conductive. The drain-source resistances, $R_{DS}$, as provided by the conductive states of each of NMOS transistors 308-312, are placed in parallel to implement a combined resistance magnitude, e.g., R1N, between output pad 210 and ground potential.

Should the resistance magnitude R1P be too large, PMOS transistors 316-320 of driver bank 328 and/or PMOS transistors 330-334 of driver bank 342 may be rendered conductive, via signals $PGATE_2$ and $PGATE_N$, respectively, as provided by pre-driver 216, so as to reduce the combined resistance magnitude R1P that is placed between output pad 210 and terminal $V_{CCO}$. Similarly, should the resistance magnitude R1N be too large, NMOS transistors 322-326 of driver bank 328 and/or NMOS transistors 336-340 of driver bank 342 may be rendered conductive, via signals $NGATE_2$ and $NGATE_N$, respectively, as provided by pre-driver 216, so as to reduce the combined resistance magnitude R1N that is placed between output pad 210 and ground potential.

It can be seen, therefore, that a programmable impedance magnitude may be placed between terminal 210 and terminal $V_{CCO}$ by rendering an appropriate number of PMOS transistors of driver banks 314, 328, and 342 conductive via signals $PGATE_1$-$PGATE_N$. Conversely, a programmable impedance magnitude may be placed between terminal 210 and ground potential by rendering an appropriate number of NMOS transistors of driver banks 314, 328, and 342 conductive via signals $NGATE_1$-$NGATE_N$. In such an instance, driver 218 of any IOB 104 of FPGA 100 of FIG. 1 may be configured as a programmable impedance component that may be utilized by a STE fixture during the course of controlled impedance testing of the remaining IOBs of one or more FPGAs 100.

Figure 4:
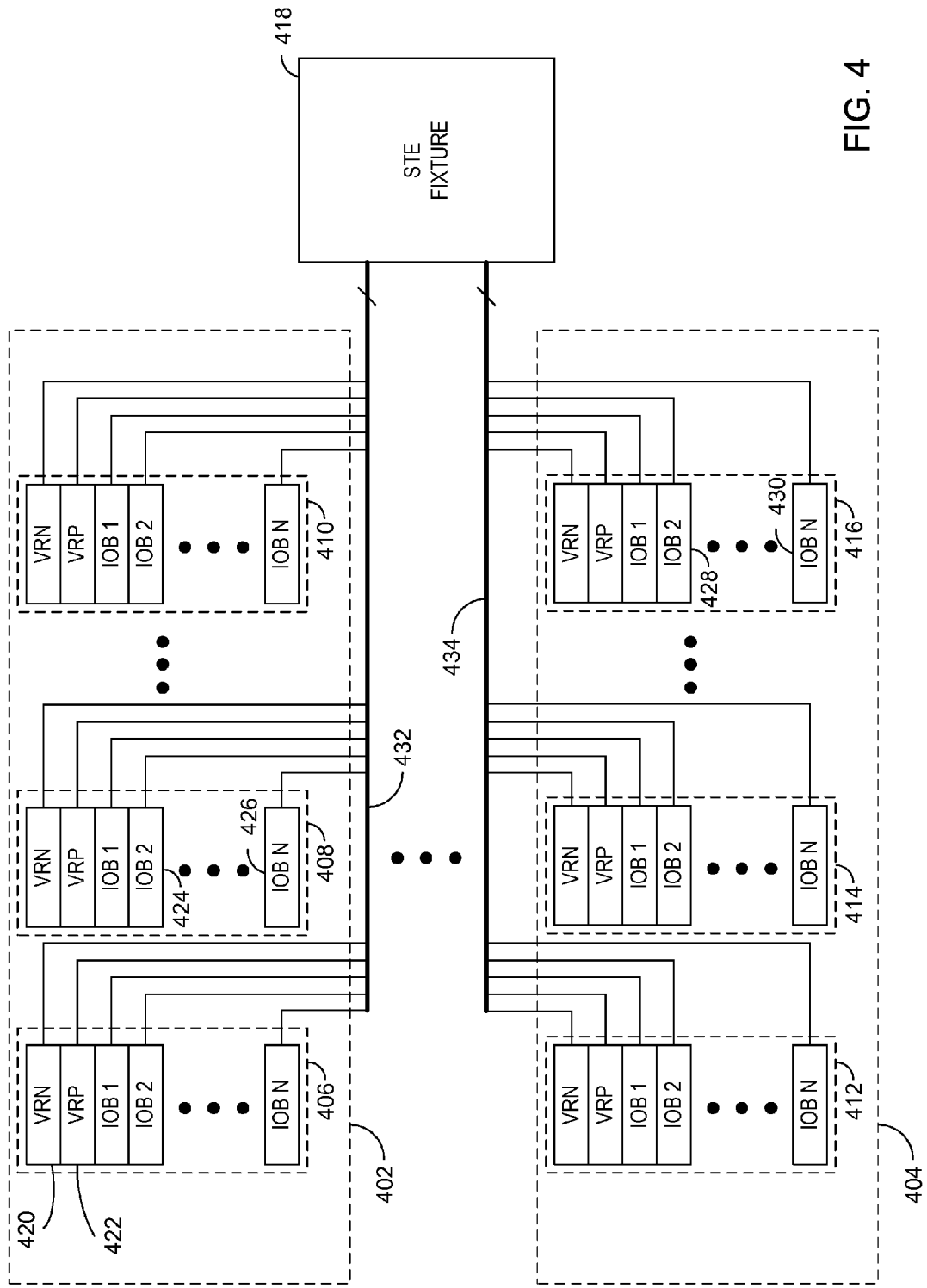
FIG. 4 illustrates a test system that may be used to test the controlled impedance operation of each IOB of FIG. 1 in accordance with an embodiment of the present invention.

Turning to FIG. 4, for example, a test system is illustrated, whereby banks of IOBs of one or more FPGAs may be simultaneously tested using various test scenarios as generated by STE fixture 418. In particular, the I/O interfaces of one or more FPGAs 402-404 may be simultaneously validated using a plurality of test scenarios as implemented by STE fixture 418. IOB banks 406-410 and 412-416 within one or more of FPGAs 402 and 404, respectively, represent a multiplicity of IOBs 104 where each IOB contains output buffer 204 and input buffer 240 as discussed above in relation to FIG. 1. Further, each output buffer 204 of each IOB contains output driver 218 as discussed above in relation to FIG. 3.

I/O pads 210 of each IOB of IOB banks 406-416 are interconnected with STE fixture 418 via interconnect buses 432 and 434. Switch matrices within STE fixture 418 allow the interconnection of any IOB to any other IOB of the same, or different, IOB bank. In such an instance, a first IOB, e.g., IOB 424, may be configured as an output driver to drive a data signal received from fabric 202 of FPGA 402 to STE fixture 418. In addition, a second IOB, e.g., IOB 426, may be configured as an input driver to receive the data signal from STE fixture 418 to be delivered to fabric 202 of FPGA 402. Daisy chaining all IOBs of FPGAs 402 and 404 in similar fashion allows each IOB to be tested simultaneously.

In the event that controlled impedance testing of the IOBs is desired, a reference impedance must first be coupled to the VRN and VRP blocks of the IOB bank that is to be tested. For example, if controlled impedance testing of IOB bank 406 is desired, e.g., during testing of the HSTL I/O standard, then a reference impedance must be connected from VRN 420 to $V_{CCO}$ and from VRP 422 to ground potential. Once the reference impedance is connected to VRN 420 and VRP 422, the DCI controller (not shown) associated with IOB bank 406 adjusts the output impedance of the output driver of each IOB to be proportional to the reference impedance magnitude that is connected to VRN 420 and VRP 422. In one embodiment, for example, the output impedance of each output driver is set to be equal to the reference impedance magnitude that is connected to VRN 420 and VRP 422. In other embodiments, the output impedance of each output driver is set to be equal to one half of the reference impedance magnitude that is connected to VRN 420 and VRP 422.

Figure 5:
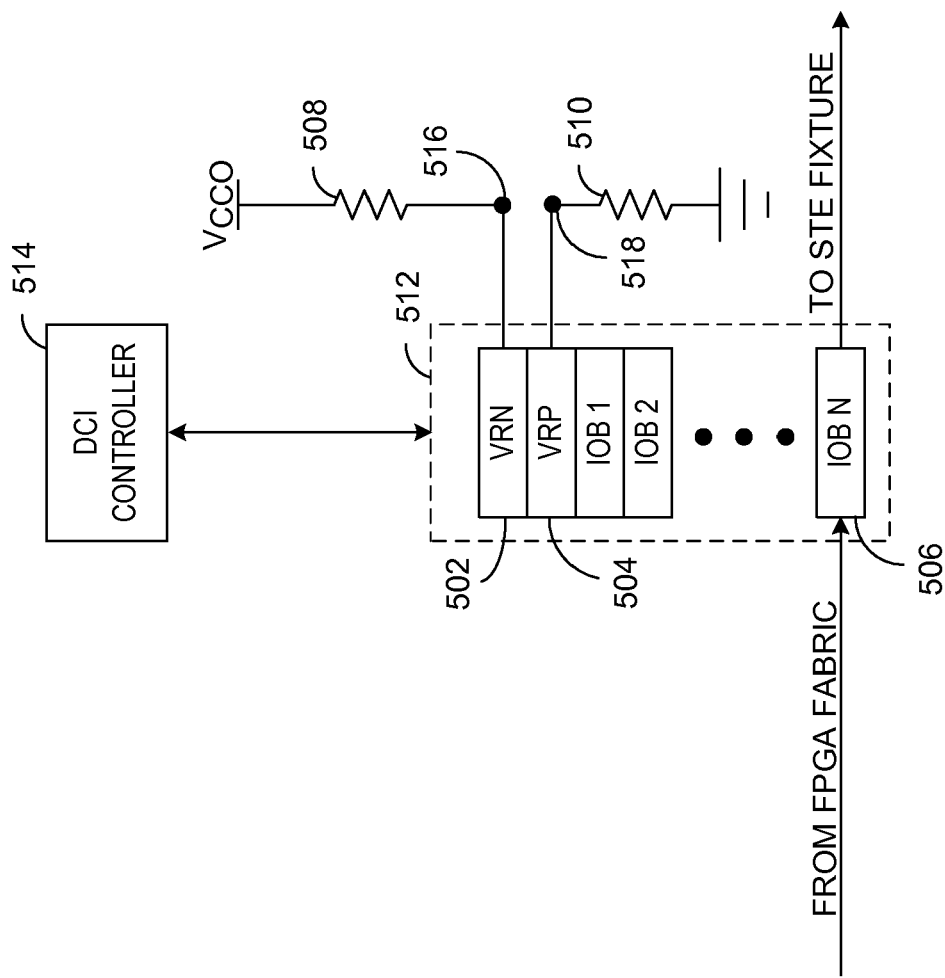
FIG. 5 illustrates a test configuration diagram for a single IOB of FIG. 1.

Turning to FIG. 5, the configuration of IOB bank 512 of a single FPGA that is be used during controlled impedance testing of IOB bank 512 is illustrated. In particular, reference resistive component 508 is connected from VRN 502 to terminal $V_{CCO}$ and reference resistive component 510 is connected from VRP 504 to ground potential as shown. DCI controller 514 then adjusts the output impedance of each output driver within IOB bank 512, as discussed above in relation to FIG. 3, to be proportional to the impedance magnitude of reference resistive components 508 and 510. Once the output impedance of the output drivers of IOB bank 512 is properly adjusted, then controlled impedance testing of, e.g., IOB 506, may be commenced in relation to the, e.g., HSTL I/O standard, that requires a controlled impedance.

In order to obviate the need for STE fixture 418 to supply reference resistive components 508 and 510 of FIG. 5 in discrete form, IOBs from other IOB banks of the same, or different, FPGAs may instead be utilized to implement reference resistive components 508 and 510. In one embodiment, for example, node 516 may be implemented by output pad 210 of an output driver of a first IOB, e.g., IOB 424 of IOB bank 408 of FPGA 402, while node 518 may be implemented by output pad 210 of an output driver of a second IOB, e.g., IOB 426 of IOB bank 408 of FPGA 402. In such an instance, STE fixture 418 interconnects output pad 210 of IOB 424 to VRN 502 at node 516, while also interconnecting output pad 210 of IOB 426 to VRP 504 at node 518.

In an alternate embodiment, reference resistive components 508 and 510 may be implemented using, e.g., IOBs 428 and 430 of FPGA 404. In such an instance, STE fixture 418 interconnects output pad 210 of IOB 428 to VRN 502 at node 516, while also interconnecting output pad 210 of IOB 430 to VRP 504 at node 518.

Reference resistive component 508 is, therefore, implemented by the parallel combination of the conductive PMOS transistors of bank(s) 314, 328, and/or 342 of the respective output driver, as discussed above in relation to FIG. 3, since the conductive PMOS transistors of the output driver form a resistive current path from node 516 to terminal $V_{CCO}$ as required by the test configuration of FIG. 5. Similarly, reference resistive component 510 is implemented by the parallel combination of the conductive NMOS transistors of bank(s) 314, 328, and/or 342 of the respective output driver, as discussed above in relation to FIG. 3, since the conductive NMOS transistors of the output driver form a resistive current path from node 518 to ground potential as required by the test configuration of FIG. 5.

Figure 6:
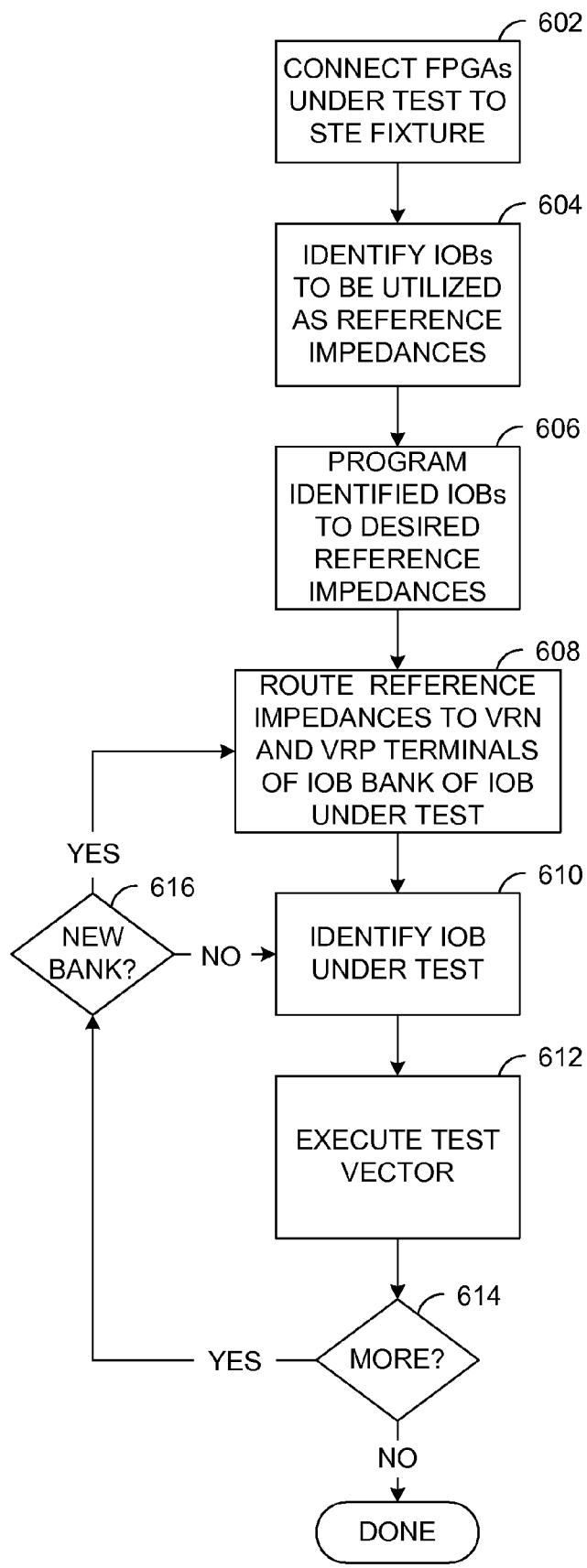
FIG. 6 illustrates a flow diagram of a method of testing each IOB of multiple FPGAs in accordance with an embodiment of the present invention.

Turning to FIG. 6, a flow diagram of a method of performing controlled impedance testing of each IOB of each FPGA under test is provided. In step 602, one or more FPGAs 402-404 are connected to STE fixture 418 as discussed above in relation to FIG. 4. In order to implement controlled impedance testing of each IOB under test, reference impedances must first be connected to the respective VRN and VRP blocks of the respective IOB bank that is under test as discussed above in relation to FIG. 5.

In order to obviate the need for STE fixture 418 to supply the reference impedances as discrete resistors, output drivers of other IOBs not under test are instead utilized as programmable reference resistive blocks as discussed above in relation to FIG. 3. In such an instance, a first output driver of a first IOB not under test may be identified in step 604 to provide reference resistive component 508 and a second output driver of a second IOB not under test may be identified in step 604 to provide reference resistive component 510, as discussed above in relation to FIG. 5. In one embodiment, IOBs existing within the same FPGA may be identified as providing the requisite reference impedances. In an alternate embodiment, IOBs existing within different FPGAs may be identified as providing the requisite reference impedances. Once the IOBs that are to provide the reference resistive components have been identified, then step 606 is executed to program the reference resistive magnitudes of each reference resistive component. In particular, the output impedance of each output driver of each identified IOB is programmed as discussed above in relation to FIG. 3.

STE fixture 418, in combination with buses 432-434, is then utilized in step 608 to route the reference resistive components provided by the IOBs not under test to the respective VRN and VRP blocks of the IOB bank that is under test. Once reference resistive components, as generated by the IOBs not under test identified in step 604, have been interconnected to the respective IOB bank that is under test and the particular IOB under test is identified in step 610, then the controlled impedance test vector may be executed by STE fixture 418 as in step 612. If other IOBs remain to be tested, as determined in step 614, then a determination is made as to whether the next IOB to be tested exists within the same IOB bank as tested in step 612. If so, then the processing sequence of steps 610-614 is repeated until controlled impedance testing of each IOB of the IOB bank is complete. If not, then step 608 must first be executed before steps 610-612, so that the reference resistive components may be routed to the next IOB bank that is to be tested.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of testing a controlled impedance driver, comprising:
    identifying a first driver of a first bank of drivers that is to be tested;
    identifying second and third drivers that are not to be tested;
    programming an output impedance of the second and third drivers to exhibit first and second impedance magnitudes;
    routing the first and second impedance magnitudes to reference impedance inputs of the first bank of drivers to control an output impedance of the first driver; and
    testing the first driver as the controlled impedance driver.

2. The method of claim 1, wherein identifying a first driver of a first bank of drivers that is to be tested comprises:
    connecting each driver of at least one integrated circuit to a test fixture;
    identifying one driver of the at least one integrated circuit as the first driver; and
    programming a switch matrix within the test fixture to route a test signal from the first driver to the test fixture.

3. The method of claim 2, wherein identifying second and third drivers that are not to be tested comprises selecting drivers of the at least one integrated circuit that are not included in the first bank of drivers.

4. The method of claim 3, wherein the selected drivers exist within the same integrated circuit.

5. The method of claim 3, wherein the selected drivers exist within different integrated circuits.

6. The method of claim 2, wherein programming an output impedance of the second and third drivers to exhibit the first and second impedance magnitudes comprises:
    programming logic states of a first plurality of logic signals;
    rendering a first set of transistors within the second driver conductive using a first portion of the first plurality of logic signals;
    rendering a second set of transistors within the second driver non-conductive using a second portion of the first plurality of logic signals; and
    establishing the first impedance magnitude with the first set of transistors from an output node of the second driver to a first power supply node of the second driver.

7. The method of claim 6, wherein programming an output impedance of the second and third drivers to exhibit the first and second impedance magnitudes further comprises:
    programming logic states of a second plurality of logic signals;
    rendering a third set of transistors within the third driver conductive using a first portion of the second plurality of logic signals;
    rendering a fourth set of transistors within the third driver non-conductive using a second portion of the second plurality of logic signals; and
    establishing the second impedance magnitude with the third set of transistors from an output node of the third driver to a first power supply reference node of the third driver.

8. The method of claim 7 wherein routing the first and second impedance magnitudes to reference impedance inputs of the first bank of drivers to control an output impedance of the first driver comprises:
    programming the switch matrix to connect the output node of the second driver to a first reference impedance input of the first bank of drivers; and
    programming the switch matrix to connect the output node of the third driver to a second reference impedance input of the first bank of drivers.

9. A method of testing a plurality of integrated circuits, comprising:
    interconnecting a plurality of driver banks of the plurality of integrated circuits using a test fixture;
    selecting a first driver bank of the plurality of driver banks to be tested;
    programming a second driver bank of the plurality of driver banks to provide a first reference impedance magnitude to the first driver bank;
    programming a third driver bank of the plurality of driver banks to provide a second reference impedance magnitude to the first driver bank;
    determining an output impedance of the first driver bank to be proportional to the first and second reference impedance magnitudes; and
    conducting controlled impedance testing of the first driver bank.

10. The method of claim 9, wherein selecting a first driver bank of the plurality of driver banks to be tested comprises:

connecting each driver of the plurality of driver banks to the test fixture;

identifying one driver bank of the plurality of driver banks as the first driver bank; and programming a switch matrix within the test fixture to route a test signal from a driver of the first driver bank to the test fixture.

11. The method of claim 10, wherein programming a second driver bank of the plurality of driver banks to provide a first reference impedance magnitude to the first driver bank comprises:

programming a first driver of the second driver bank to provide the first reference impedance magnitude; and programming the switch matrix to route an output node of the first driver of the second driver bank to a first reference impedance node of the first driver bank.

12. The method of claim 11, programming a first driver of the second driver bank to provide the first reference impedance magnitude:

programming logic states of a first plurality of logic signals;

rendering a first set of transistors within the first driver of the second driver bank conductive using a first portion of the first plurality of logic signals;

rendering a second set of transistors within the first driver of the second driver bank non-conductive using a second portion of the first plurality of logic signals; and establishing the first reference impedance magnitude with the first set of transistors of the second driver bank from the output node of the second driver bank to a first power supply node of the second driver bank.

13. The method of claim 12, wherein programming a third driver bank of the plurality of driver banks to provide a second reference impedance magnitude to the first driver bank comprises:

programming a first driver of the third driver bank to provide the second reference impedance magnitude; and programming the switch matrix to route an output node of the first driver of the third driver bank to a second reference impedance node of the first driver bank.

14. The method of claim 13, wherein programming a first driver of the third driver bank to provide the second reference impedance magnitude:

programming logic states of a second plurality of logic signals;

rendering a first set of transistors within the first driver of the third driver bank conductive using a first portion of the second plurality of logic signals;

rendering a second set of transistors within the first driver of the third driver bank non-conductive using a second portion of the second plurality of logic signals; and establishing the second reference impedance magnitude with the first set of transistors of the third driver bank from the output node of the third driver bank to a first power supply reference node of the third driver bank.

15. The method of claim 14, wherein the second and third driver banks exist on the same integrated circuit as the first driver bank.

16. The method of claim 15, wherein the second and third driver banks exist on a different integrated circuit as the first driver bank.

17. A test system, comprising:

a plurality of programmable logic devices, each of the programmable logic devices including a plurality of driver banks, each driver bank including an output driver configurable as a programmable resistive component;

a test fixture coupled to an output node of each output driver included within each of the plurality of driver banks, the test fixture being further coupled to reference impedance nodes of the plurality of driver banks; and wherein the test fixture is adapted to connect each output driver configured as a programmable resistive component to the reference impedance nodes of a driver bank under test to program an impedance value of the driver bank under test.

18. The test system of claim 17, wherein each output driver included within the plurality of driver banks comprises a plurality of transistor banks coupled to receive first and second logic signals, the conductivity state of the plurality of transistor banks being controlled by the first and second logic signals to provide the programmable resistive component.

19. The test system of claim 18, wherein the plurality of transistor banks comprises a first plurality of transistors having a first conductivity type, each of the first plurality of transistors having a first conductor coupled to a first power supply node and a second conductor coupled to the output node of the output driver.

20. The test system of claim 19, wherein the plurality of transistor banks further comprises a second plurality of transistors having a second conductivity type, each of the second plurality of transistors having a first conductor coupled to the output node of the output driver and a second conductor coupled to a first power supply reference node.

* * * * *